United States Patent
Kohno et al.

(10) Patent No.: US 6,448,587 B1
(45) Date of Patent: Sep. 10, 2002

(54) CIRCUIT INCORPORATED IGBT AND POWER CONVERSION DEVICE USING THE SAME

(75) Inventors: Yasuhiko Kohno, Hitachi; Mutsuhiro Mori, Mito; Junpei Uruno, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/985,977

(22) Filed: Nov. 7, 2001

Related U.S. Application Data

(63) Continuation of application No. 09/199,276, filed on Nov. 25, 1998, now abandoned.

(30) Foreign Application Priority Data

Nov. 28, 1997 (JP) .............................................. 9-327572

(51) Int. Cl.⁷ ...................... H01L 29/74; H01L 31/111; H01L 29/76; H01L 29/94
(52) U.S. Cl. ...................... 257/133; 257/146; 257/370; 257/378
(58) Field of Search ................................. 257/139, 140, 257/401, 335–339, 126, 127, 370, 378, 379, 502, 503, 360, 363, 154, 146, 394, 373, 133

(56) References Cited

U.S. PATENT DOCUMENTS

| | | | |
|---|---|---|---|
| 5,245,202 A | 9/1993 | Yasukazu | 257/133 |
| 5,304,802 A | 4/1994 | Kumagai | 257/328 |
| 5,631,494 A | 5/1997 | Sakurai et al. | 257/572 |
| 5,672,893 A | 9/1997 | Tihanyi | 257/328 |
| 5,703,385 A | 12/1997 | Zambrano | 257/212 |
| 5,777,367 A | 7/1998 | Zambrano | 257/355 |
| 5,798,538 A | * 8/1998 | Nadd et al. | 257/139 |

FOREIGN PATENT DOCUMENTS

JP  A5235363  9/1994

* cited by examiner

Primary Examiner—Steven Loke
Assistant Examiner—Shouxiang Hu
(74) Attorney, Agent, or Firm—Antonelli, Terry, Stout & Kraus, LLP

(57) ABSTRACT

A circuit incorporated IGBT is provided with a semiconductor substrate having an IGBT area and a circuit area which are adjacent to each other. In a semiconductor layer of one conductivity type in which a circuit element is formed in the circuit area, there is provided another semiconductor layer of another conductivity type which adjoins the circuit element and has an impurity concentration higher than that of the semiconductor layer of the one conductivity type. An electrode contacts the other semiconductor layer and is connected to an electrode of the IGBT. Carriers are ejected from the other semiconductor layer to the electrode of the IGBT, thereby making it possible to prevent an erroneous operation of the circuit.

6 Claims, 11 Drawing Sheets

CIRCUIT INCORPORATED IGBT AND POWER CONVERSION DEVICE USING THE SAME

CROSS-REFERENCE TO RELATED APPLICATION:

This application is a continuing application of Ser. No. 09/199,276 filed Nov. 25, 1998 now abandoned.

BACKGROUND OF THE INVENTION

The present invention relates to a circuit incorporated IGBT in which an IGBT and a circuit are formed in a semiconductor substrate.

An insulated gate bipolar transistor (hereinafter abbreviated to IGBT) is a voltage controlled switching element which can control a current of a main terminal by a voltage of a control terminal. Since a large current and switching at a high frequency are possible, IGBT's are being used at the present time in a wide field of applications from household air conditioners to inverters of electric cars and so forth.

Hitherto, the contemplation of a low loss and a high speed was made for IGBT's. In recent years, not only the low loss and the high speed but also a high functionality have been promoted. A high-function IGBT includes, for example, an IGBT in which the IGBT is integrated with a protection circuit so that a protecting function is possessed by one chip. A problem encountered in integrating an IBGT with a circuit is an erroneous operation of the circuit caused by a carrier current or hole current peculiar to the IGBT. When a hole current injected from a collector layer of the IGBT flows into a circuit area, an erroneous operation of the circuit occurs. There has been disclosed a structure in which a layer for ejecting holes is provided in order to prevent the hole current from flowing into the circuit area.

FIG. 11 shows the cross-sectional structure of a circuit integrated IGBT having a hole ejecting layer. In FIG. 11, reference numeral 101 denotes a collector layer, numeral 102 a buffer layer, numeral 103 a drift layer, numeral 104 a channel layer, numeral 105 an emitter layer, numeral 106 a hole ejecting layer, numeral 110 an emitter electrode, numeral 111 a gate electrode, numeral 112 a gate oxide film, numeral 114 a source electrode, numeral 115 a MOSFET gate electrode, numeral 116 a drain electrode, numeral 117 a collector electrode, numeral 131 a source layer, numeral 132 a base layer, numeral 133 a drain layer, numeral 150 an IGBT area, numeral 151 a circuit area, and numeral 152 a lateral MOSFET. Though not shown in FIG. 11, resistors, diodes and so forth are formed as circuit forming elements other than the MOSFET in the circuit area 151. Similarly, though not shown, the source electrode 114, gate electrode 115 and drain electrode 116 of the MOSFET are connected to the other elements formed in the circuit area and the emitter electrode 110 and gate electrode 111 of the IGBT. In a turned-on condition of the IGBT, a hole current flows from the collector layer to the emitter layer, as shown by arrow in FIG. 11. In order to suppress the flow of this hole current into the circuit area, the hole ejecting layer 106 is provided to prevent the hole current from flowing from the IGBT area into the circuit area.

In recent years, however, the high functionality and high preciseness of a circuit integrated in an IGBT have been advanced and there has been generated a problem that an erroneous operation of the circuit occurs even with a very small leakage current of holes. This is because even if the hole ejecting layer 106 is provided, a very small amount of holes may leak into the circuit area. Such an erroneous operation is remarkable in the case where an IGBT is integrated with a source follower circuit using a MOSFET.

FIGS. 12 and 13 show the cross section and the equivalent circuit of an IGBT integrated with a source follower circuit. In FIGS. 12 and 13, the same constituent elements as those in FIG. 11 are denoted by the same reference numerals as those used in FIG. 11. In FIGS. 12 and 13, reference numeral 140 denotes a source follower resistor, numeral 201 an n-channel MOSFET corresponding to a channel portion of the IGBT, numeral 202 an npn transistor composed of the drift layer, the channel layer and the emitter layer, numeral 203 a pnp transistor of an MOSFET composed of the collector layer, the buffer layer, the drift layer and the channel layer, numeral 204 an npn transistor of a MOSFET composed of the drift layer, the base layer and the emitter layer, and numeral 205 the lateral MOSFET.

In the conventional structure, a leakage hole current flows into the source electrode 114 of the MOSFET through the base layer 132. When the hole current flows into the source electrode, a voltage generated across the source follower resistor 140 becomes higher than a desired voltage, thereby causing an erroneous operation of the circuit.

The present invention is made taking the above problem into consideration and provides a circuit incorporated IGBT which can prevent an erroneous operation of a circuit.

SUMMARY OF THE INVENTION

A circuit incorporated IGBT according to the present invention is provided with a semiconductor substrate having an IGBT area and a circuit area which are adjacent to each other. In a semiconductor layer of one conductivity type in which a circuit element is formed in the circuit area, there is provided another semiconductor layer of another conductivity type which adjoins the circuit element and has an impurity concentration higher than that of the semiconductor layer of the one conductivity type. An electrode contacts such other semiconductor layer and this electrode is connected to an electrode of an IGBT in the IGBT area.

According to the present invention, carriers are ejected from the second semiconductor layer to the electrode of the IGBT, thereby making it possible to prevent an erroneous operation of a circuit.

The one conductivity type may be p type or n type. The electrode of the IGBT is, for example, an emitter electrode. Carriers are holes or electrons.

DESCRIPTION OF THE PREFERRED EMBODIMENTS

Embodiment 1

Figure 1:
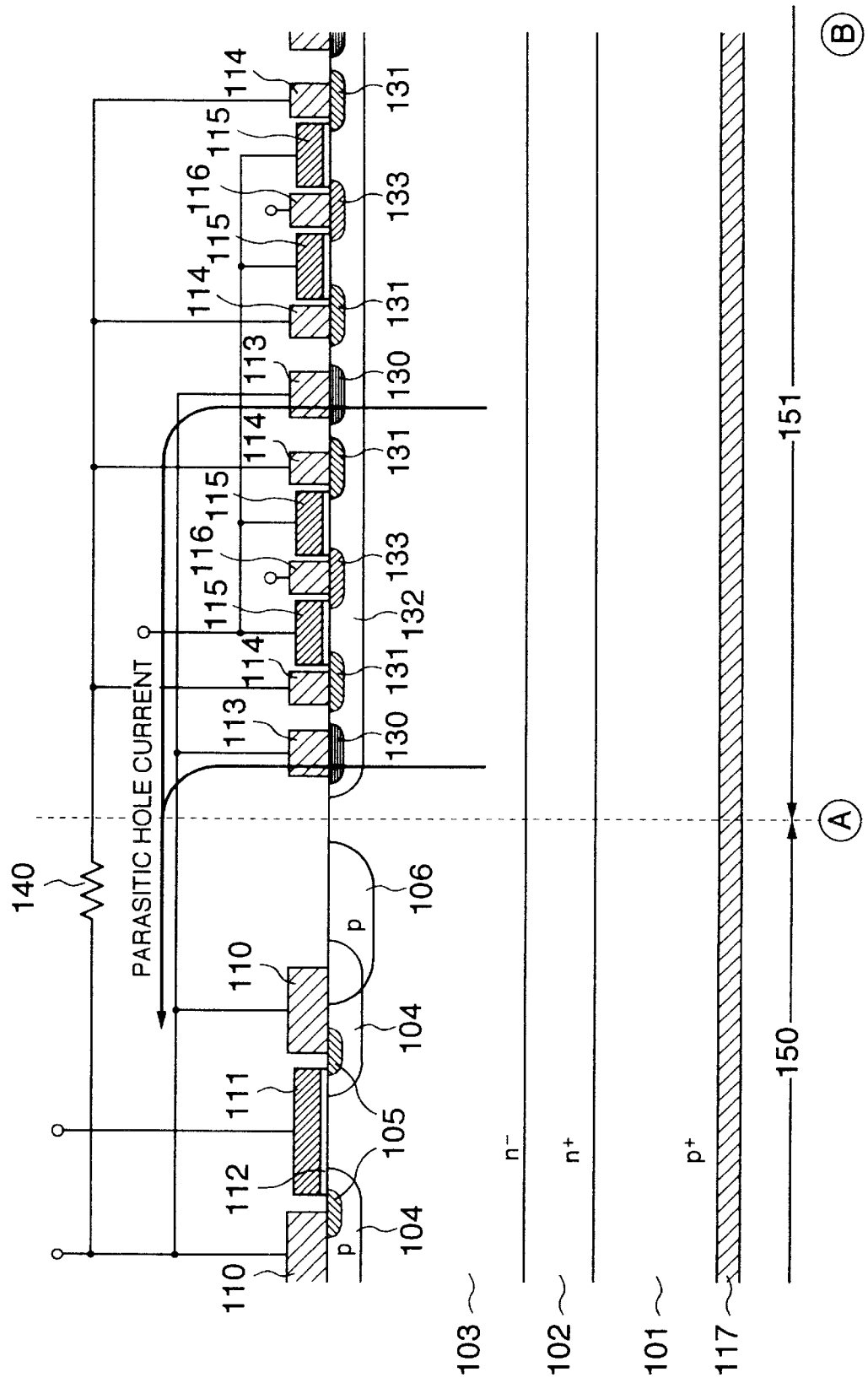
FIG. 1 is the cross section of a first embodiment according to the present invention.
Figure 2:
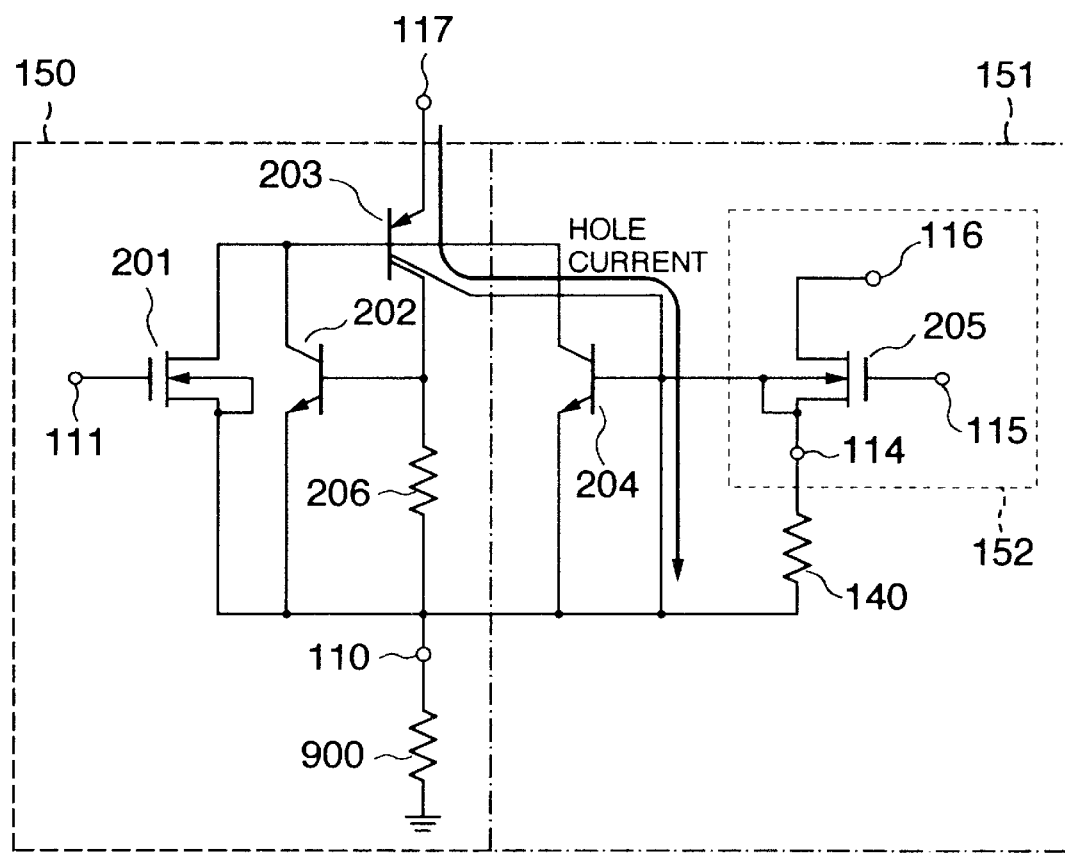
FIG. 2 is an equivalent circuit diagram of the first embodiment according to the present invention.

FIG. 1 shows the cross-sectional structure of a first embodiment according to the present invention and FIG. 2 shows an equivalent circuit thereof. The present embodiment is an example of a circuit incorporated IGBT in which a source follower circuit is incorporated.

Figure 11:
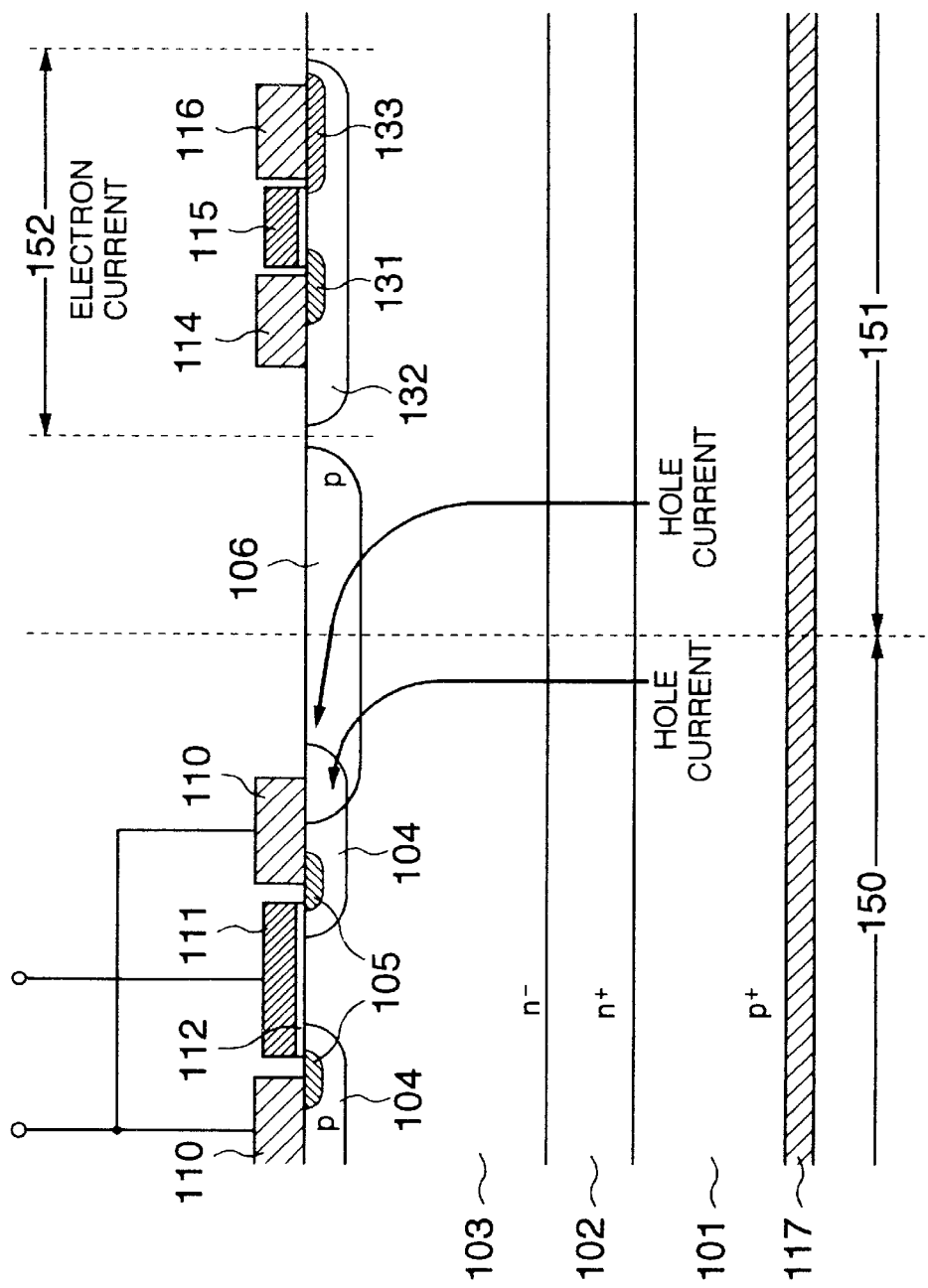
FIG. 11 is the cross section of the conventional circuit incorporated IGBT having a hole ejecting layer.
Figure 12:
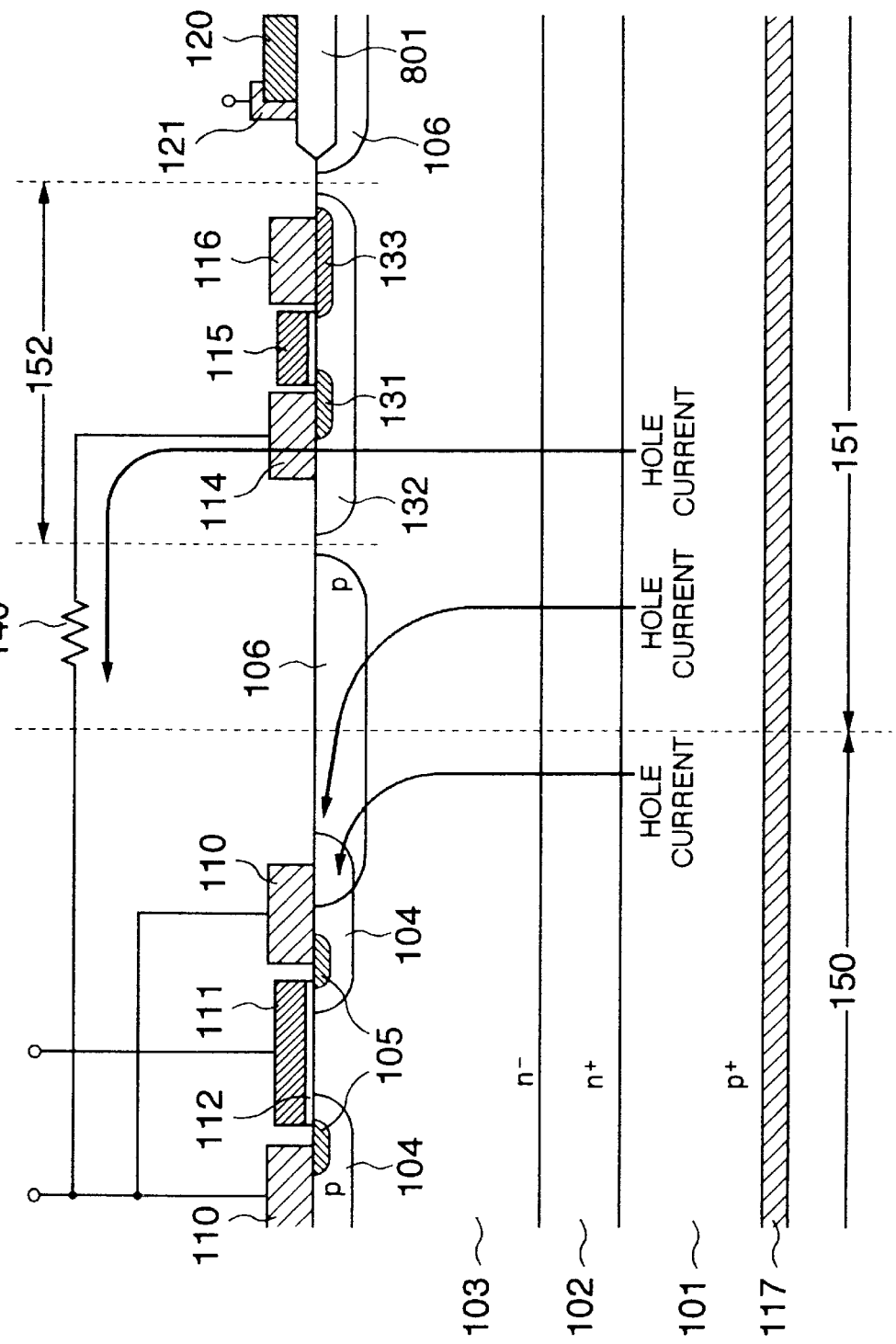
FIG. 12 is the cross section of the conventional IGBT integrated with a source follower circuit.
Figure 13:
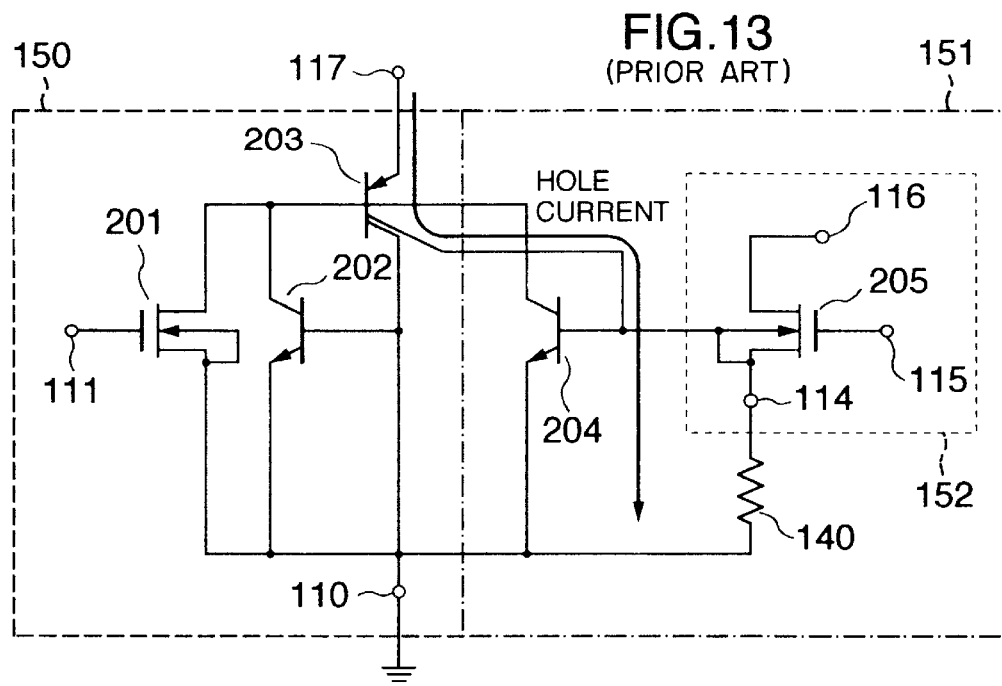
FIG. 13 is an equivalent circuit diagram of the conventional IGBT integrated with the source follower circuit.

In FIGS. 1 and 2, the same constituent elements as those in FIGS. 11 to 13 are denoted by the same reference numerals as those in FIGS. 11 to 13. In FIGS. 1 and 2, reference numeral 113 denotes an earth electrode and numeral 130 denotes an earth layer. In the following description, symbols p⁻, p and p⁺ show that the conductivity type of a semiconductor layer is p type (or one conductivity type) and the impurity concentration thereof is relatively high in the mentioned order. Similarly, symbols n⁻, n and n⁺ show that the conductivity type of a semiconductor layer is n type (or another conductivity type) and the impurity concentration thereof is relatively high in the mentioned order.

As shown in FIG. 1, an IGBT area 150 and a circuit area 151 are provided adjacent to each other in one semiconductor substrate. The IGBT area 150 includes a collector layer 101 (or a first layer) of p⁺ type adjoining one principal surface of the semiconductor substrate, a buffer layer 102 (or a first portion of a second layer) of n⁺ type adjoining the collector layer 101, a drift layer 103 (or a second portion of the second layer) of n⁻ type adjoining the buffer layer 102 and the other principal surface of the semiconductor substrate, a plurality of channel layers 104 (or third layers) of p type adjoining the other principal surface of the semiconductor substrate and selectively formed in the drift layer 103, an emitter layer 105 (or a fourth layer) of n⁺ type adjoining the other principal surface of the semiconductor substrate and selectively formed in the channel layer 104, and a hole ejecting layer 106 of p type adjoining the other principal surface of the semiconductor substrate, contacting the channel layer 104 adjacent to the circuit area 151 and having a junction depth deeper than that of the channel layer 104. Further, the IGBT area 150 is provided with a gate electrode 111 (or a first electrode) formed through a gate oxide film 112 as an insulating film on an exposed portion of the surface of the channel layer 104 between the drift layer 103 and the emitter layer 105 on the other principal surface side of the semiconductor substrate, an emitter electrode 110 (or a second electrode) formed in contact with the channel layer 104 and the emitter layer 105, and a collector electrode 117 (or a third electrode) formed on the one principal surface of the semiconductor substrate in contact with the collector layer 101. The circuit area 151 is provided with the collector layer 101, the buffer layer 102, the drift layer 103 and the collector electrode 117 which extend from the IGBT area. Also, the circuit area 151 includes a base layer 132 (or a fifth layer) of p type adjoining the other principal surface of the semiconductor substrate and selectively formed in the drift layer 103, a source layer 131 (or a seventh layer) and a drain layer 133 (or an eighth layer) of n' type adjoining the other principal surface of the semiconductor substrate and selectively formed in the base layer 132, another gate electrode 115 (or a fifth electrode) formed through a gate oxide film on an exposed portion of the surface of the base layer 132 between the source layer 131 and the drain layer 133 on the other principal surface side of the semiconductor substrate, a source electrode 114 (or a sixth electrode) formed in contact with the source layer 131, and a drain electrode 116 (or a seventh electrode) formed in contact with the drain layer 133. The base layer 132, the source layer 131, the drain layer 133, the gate electrode 115, the source electrode 114 and the drain electrode 116 forms a lateral MOSFET. The lateral MOSFET is one circuit element in a circuit such as a protection circuit of the IGBT formed in the circuit area 151. A resistor 140 as another circuit element or a source follower resistor is connected between the source electrode 114 of the lateral MOSFET and the emitter electrode 110 of the IGBT. Namely, a source follower circuit is formed. The circuit area 151 further includes an earth layer 130 (or a sixth layer) of p⁺ type adjoining the other principal surface of the semiconductor layer and selectively formed in the base layer 132, the earth layer 130 being disposed adjacent to the source layer 131 and having an impurity concentration higher than that of the base layer 132, and an earth electrode 113 (or a fourth electrode) formed in ohmic contact with the earth layer 130. The earth electrode 113 is electrically connected to the emitter electrode 110 by virtue of electrode wiring. A circuit element other than the lateral MOSFET may be formed in the base layer 132.

A feature of the present embodiment lies in that the earth layer 130 is provided for the lateral MOSFET and this earth layer 130 is connected to the emitter electrode 110 of the IGBT through the earth electrode 113. With the provision of the earth layer 130, a hole current flowing from the collector layer 117 into the base layer 132 can be ejected from the earth layer 130 to the emitter electrode 110 without passing through the source follower circuit or the source electrode 114. Accordingly, it is possible to separate a current flowing through the source follower circuit and the hole current. Thereby, variations of a voltage generated across the source follower resistor 140 are suppressed so that an erroneous operation can be prevented.

Another feature of the present invention lies in that unit cell structures of the lateral MOSFET are symmetrically arranged so that the earth layers 130 are periodically arranged. With the construction in which the earth layers 130 are periodically arranged, as shown in FIG. 1, a hole current leaking into the circuit area is ejected to the earth layers 130, thereby making it possible to prevent the hole current from flowing into the source layers 131. Also, since the earth layers 130 are periodically arranged, it is possible to fix the potential of the base layer to an earth potential, thereby preventing a substrate bias effect due to variations in potential of the base layer and so forth to improve the precision of the circuit.

The construction of the present embodiment can also be applied to a circuit other than the above-mentioned source follower circuit composed of the lateral MOSFET and the resistor. Namely, the construction of the present embodiment is effective in the case where a circuit element is formed in the base layer 132, and the circuit element and the emitter electrode 110 are connected through another circuit element such as a resistor. In this case, the earth layer is provided adjacent to the circuit element formed in the base layer 132, and the earth layer 130 and the emitter layer 110 are electrically connected. Thereby, an erroneous operation caused by a hole current flowing into the circuit area can be prevented in a manner similar to that in the embodiment shown in FIG. 1.

Figure 3:
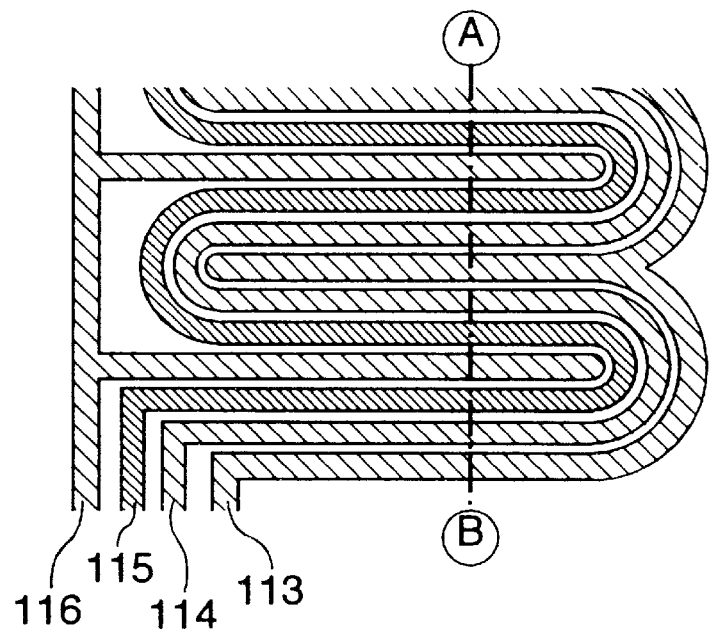
FIG. 3 is a plan view of the first embodiment according to the present invention.
Figure 4:
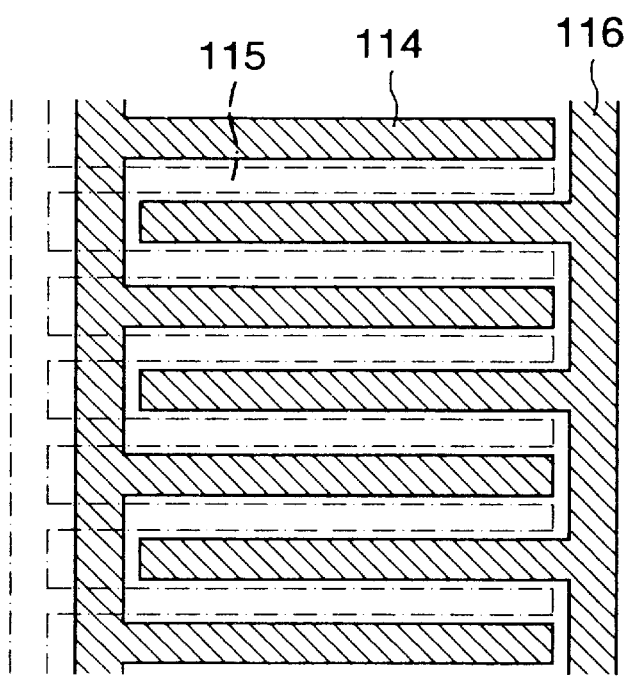
FIG. 4 is a plan view for explaining the conventional MOSFET.

FIG. 3 shows a plane layout of the first embodiment. A-B in FIG. 3 corresponds to the A-B cross section in FIG. 1. In order to realize a structure having the earth electrode, the electrode arrangement of the lateral MOSFET in the present embodiment is implemented with a structure in which an electrode is folded back at a terminating portion thereof, as shown in FIG. 3. The drain electrode 116 and the earth electrode 113 are substantially comb-like similarly to the conventional MOSFET. The gate electrode 115 and the source electrode 114 are formed between the comb-like patterns of interdigitally formed drain and earth electrodes 116 and 113 and along the comb-like patterns. The gate electrode 115 and the source electrode 114 lie in zigzag lines on the semiconductor substrate surface since they are folded back at the terminating portions of the teeth of the comb-like patterns of the drain electrode 116 and the earth electrode 113. For comparison, a plane layout explaining the conventional MOSFET is shown in FIG. 4. In FIG. 4, a gate electrode 115 is shown by dotted line since the gate electrode 115 is arranged through an insulating film below the drain electrode 116 and the source electrode 114. In the conventional MOSFET, the electrode is a comb-like form shown in FIG. 4. Therefore, the realization of a construction the periodical arrangement of earth electrodes cannot avoid the crossing of wiring. Since the wiring is made of a metal film, the crossing of wiring requires a multi-layer structure. In the conventional MOSFET, the gate electrode is actually formed by multi-layer wiring. The multi-layer structure causes problems including an increase in cost due to an increase in number of fabrication steps, the enlargement of unevenness of the surface of a circuit element, and so forth.

In the present embodiment, a plane pattern of the earth layer 130 extends adjacent to a plane pattern of the source layer 131 and along the plane pattern of the source layer 131, as is apparent from the electrode pattern shown in FIG. 3. Accordingly, a hole current is difficult to flow into the source layer. In addition, since the plane pattern of the earth layer 130 extends along the whole of the plane pattern of the source layer 131, an effect of preventing the hole current from flowing into the source layer 131 is large. Further, since the earth electrode 113 contacts the earth layer 130 along the plane pattern of the earth layer 130, it is enough to eject the hole current to the emitter electrode.

According to the present embodiment, with the structure in which the electrode of the MOSFET is folded back at its terminating portion, the four electrodes including the earth electrode, the gate electrode, the source electrode and the drain electrode can be laid out without using the multi-layer wiring or the crossing of wiring. Also, since the folding portion of the electrode is rounded, as shown in FIG. 3, there is a feature that the deterioration of the breakdown voltage of a junction between the base layer and the drift layer can be prevented.

Embodiment 2

Figure 5:
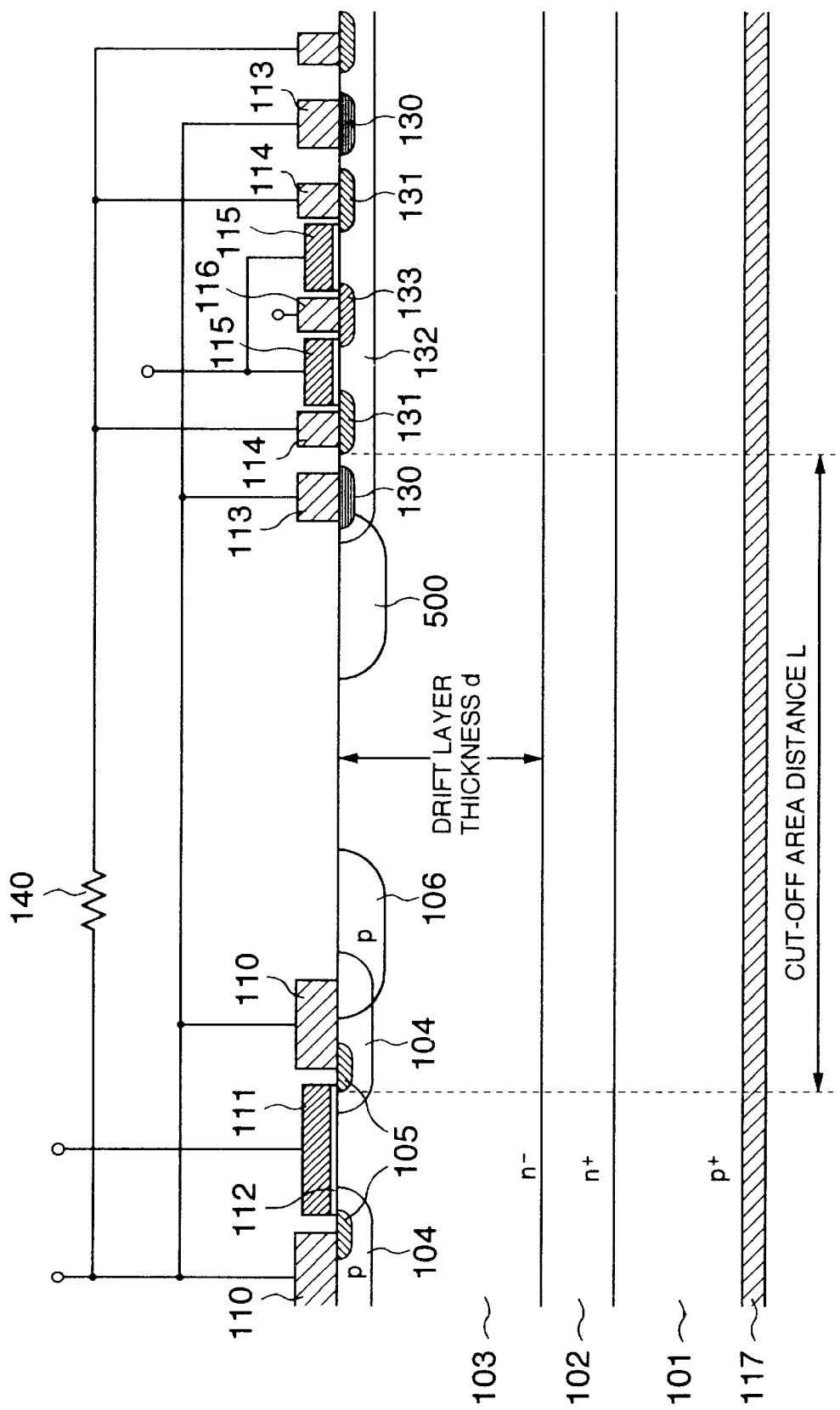
FIG. 5 is the cross section of a second embodiment according to the present invention.

FIG. 5 shows a second embodiment according to the present invention. In FIG. 5, the same constituent elements as those in FIGS. 1 to 4 are denoted by the same reference numerals as those in FIGS. 1 to 4. In FIG. 5, reference numeral 500 denotes a cut-off layer.

A feature of the present embodiment lies in that a cut-off area is provided between the IGBT and the MOSFET and the width or distance L of the cut-off area is made equal to or larger than the thickness d of the drift layer 103. The distance L is a distance between the termination of the channel of the IGBT nearest to the circuit area or the terminating portion of the gate electrode 111 and the IGBT area side terminating portion of the source layer 131 of the lateral MOSFET nearest to the IGBT area.

A hole current injected from the collector layer 101 progresses in the drift layer 103 by virtue of a drift electric-field. At this time, the progressing direction of the hole current is scattered at 45 degrees at the greatest due to the scattering by crystals of the drift layer 103, a lateral electric-field in the drift layer 103, and so forth. Thus, in the present embodiment, this scattering is taken into consideration so that the distance L between the IGBT and the MOSFET is set to be at least equal to or larger than the thickness d of the drift layer. Thereby, the cut-off area is wider than the scattering distance of the hole current in a lateral direction. Therefore, it is possible to suppress the arrival of the hole current at the MOSFET. At this time, holes injected from the collector layer 101 are ejected from the earth layer 130 to the emitter electrode 110 in a manner similar to that in the first embodiment.

Though the effect of prevention of a hole current from flowing into the MOSFET becomes larger as the distance L of the cut-off area is made wider, there is a problem that the breakdown voltage is deteriorated. Therefore, L must be set within a range in which the breakdown voltage is not deteriorated. Alternatively, there is preferable a structure in which the cut-off layer 500 is formed as shown in FIG. 5, thereby preventing the deterioration of the breakdown voltage.

Embodiment 3

Figure 6:
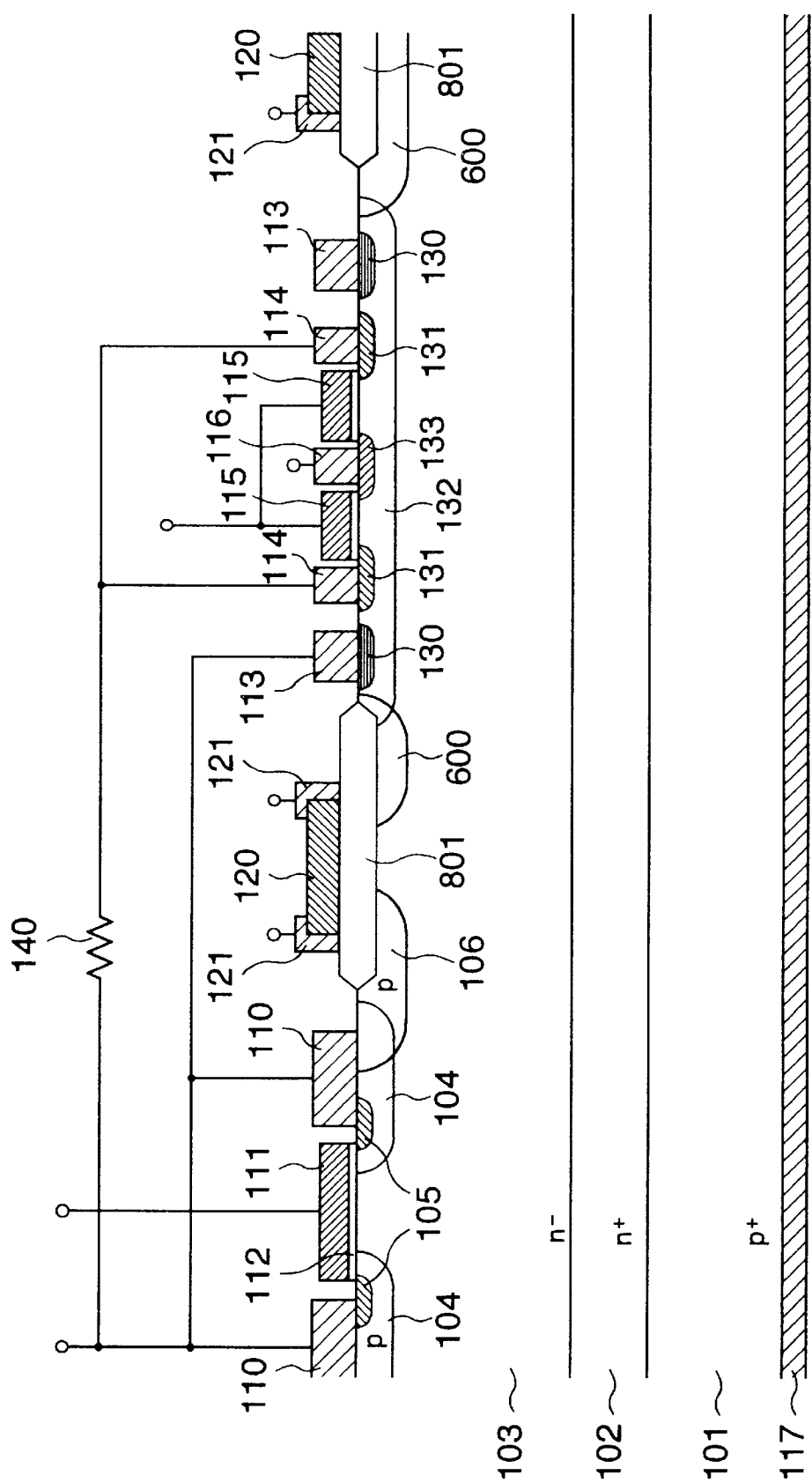
FIG. 6 is the cross section of a third embodiment according to the present invention.

FIG. 6 shows a third embodiment according to the present invention.

The structure of FIG. 5, in which the width of the cut-off area is made equal to or larger than the thickness of the drift layer, has a problem that the circuit area is correspondingly increased, thereby making the chip size large. In the present embodiment shown in FIG. 6, a circuit element such as a resistor or diode is disposed in the cut-off area, thereby making the effective use of the space of the circuit area to suppress an increase in chip area. The circuit element disposed in the cut-off area must be a circuit element free from the influence of a hole current. For example, a resistor, diode or the like formed on an oxide film is preferable. In the present embodiment, there is provided a resistor element including a resistor 120 of a polycrystalline semiconductor which is formed on an oxide film 801 and electrode terminals 121 which contact opposite ends of the resistor 120. Also, a hole ejecting layer 106 of the same conductivity type as that of the earth layer and a cut-off layer 600 are provided in a drift layer of the cut-off area under the oxide film 801. With the provision of the cut-off layer 600, it is possible to further suppress the flow-in of a hole current from the IGBT and to prevent the deterioration of the breakdown voltage. Further, it is preferable that the cut-off layer 600 is formed in not only the cut-off area but also a region in the circuit area between the MOSFET and the other circuit element. Since the cut-off layer is connected to an earth potential, there is an effect that the potential of the circuit area is stabilized, thereby improving the reliability of the circuit operation.

Figure 7:
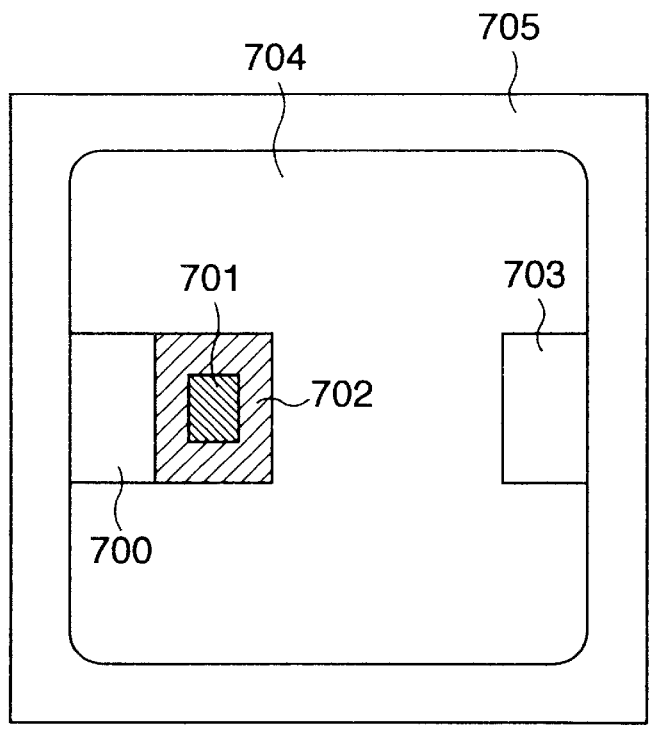
FIG. 7 is a plan view of the third embodiment according to the present invention.

FIG. 7 shows a plane layout of the third embodiment. In FIG. 7, the same constituent elements as those in FIGS. 1 to 6 are denoted by the same reference numerals as those in FIGS. 1 to 6. In FIG. 7, reference numeral 700 denotes a gate pad which serves as a connection location for connecting an external circuit to the gate electrode 111 and to which the gate electrode 111 is connected, numeral 701 a MOSEFT formation area, numeral 702 a cut-off area, numeral 703 denotes an emitter pad which serves as a connection location for connecting an external circuit to the emitter electrode 110 and to which the emitter electrode 110 is connected, numeral 704 an IGBT area, and numeral 705 a termination area.

In the present embodiment, the MOSFET formation area is disposed at the central portion of the circuit area and is surrounded by the cut-off area, thereby suppressing the flow-in of a hole current from the IGBT. As mentioned above, a resistor, diode or the like through an insulating film is disposed in the cut-off layer in order to make the effective use of the space. Though not shown in FIG. 7, the cut-off layer 600 is disposed in a region of the circuit area having not the MOSFET, thereby stabilizing the potential of the circuit. In the present embodiment, the circuit area is disposed beside the gate pad, thereby minimizing a delay of the circuit operation for an IGBT control signal inputted to the gate.

Embodiment 4

Figure 8:
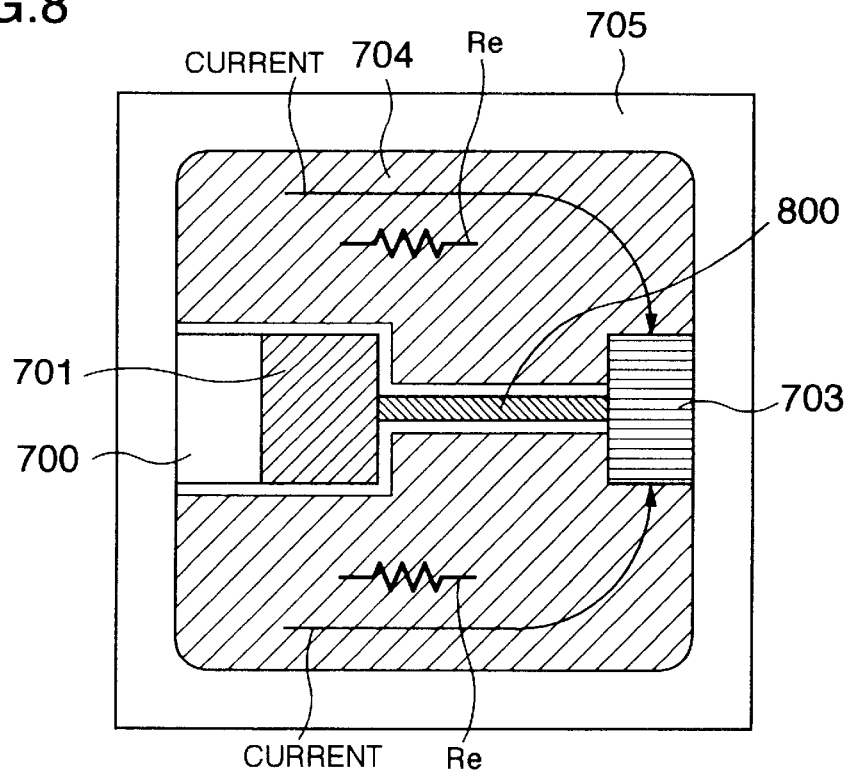
FIG. 8 is a plan view of a fourth embodiment according to the present invention.

FIG. 8 shows a cross-sectional structure of a fourth embodiment according to the present invention.

A feature of the present embodiment lies in that the emitter pad 703 and the earth electrode 113 or the earth layer 130 are connected by a wiring electrode 800. The emitter electrode of the IGBT has a resistance component Re, as shown in FIG. 8.

In the equivalent circuit shown in FIG. 2, the resistance component Re is shown by a resistor 900. Since a reference potential of the circuit is derived from the emitter electrode of the IGBT, the reference potential of the circuit may change due to a voltage produced across the resistor Re 900 of the emitter electrode by the flow of a current in the IGBT, thereby bringing about an erroneous operation of the circuit. According to the present embodiment, the earth layer 130 providing a reference potential of the circuit is connected to the emitter pad 703 by the wiring electrode 800 independent of the emitter electrode 111 of the IGBT, thereby making it possible to prevent a change in earth potential which may be caused by the resistor Re.

Figure 9:
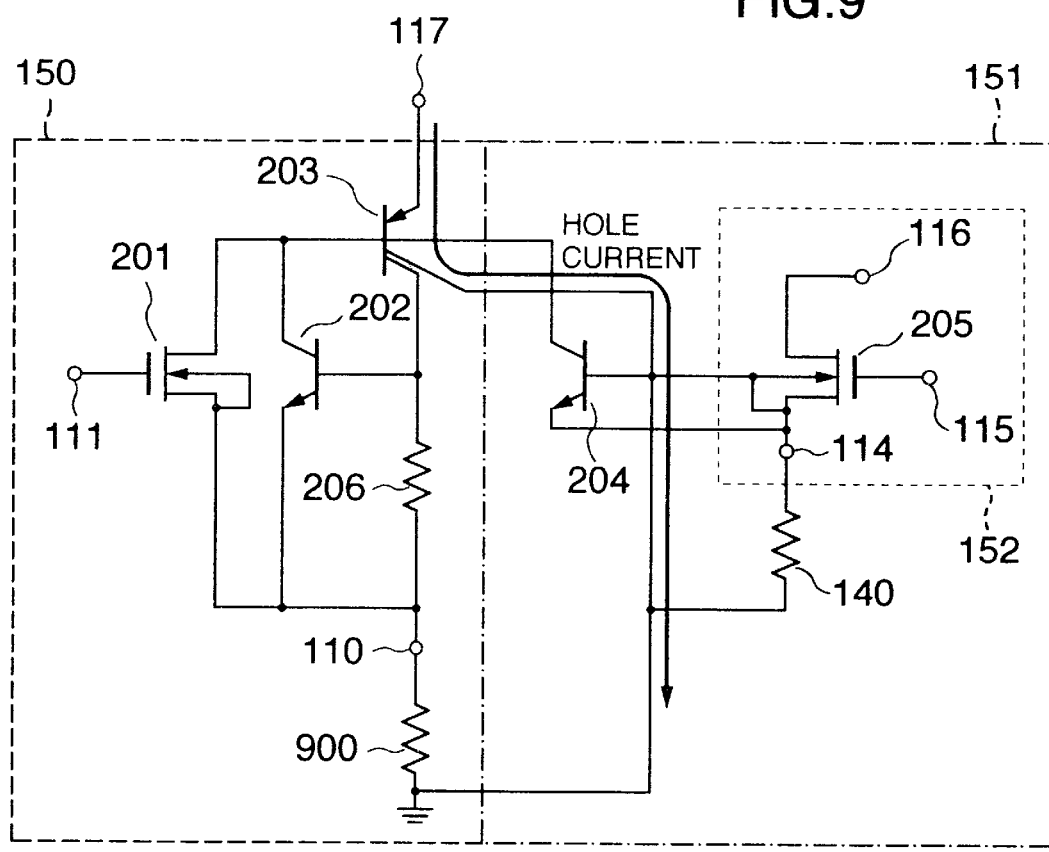
FIG. 9 is an equivalent circuit diagram of the fourth embodiment according to the present invention.

An equivalent circuit is shown in FIG. 9. Since the earth layer of the circuit is directly connected to the emitter pad 703, it is possible to eject a hole current without being passed through the resistor Re. As a result, an erroneous operation of the circuit can be prevented.

Figure 10:
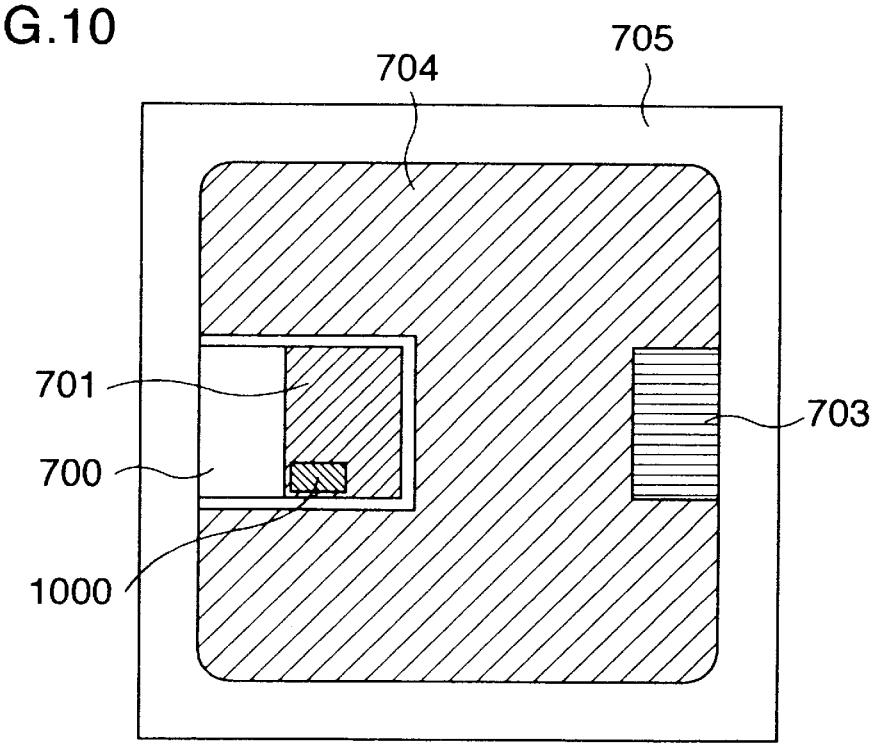
FIG. 10 is a plan view of the modification of the fourth embodiment according to the present invention.

FIG. 10 shows the modification of the fourth embodiment. In FIG. 10, the same constituent elements as those in FIGS. 1 to 9 are denoted by the same reference numerals as those in FIGS. 1 to 9. In FIG. 10, reference numeral 1000 denotes an earth pad.

A feature of this modification lies in that the earth pad is provided and the earth layer is connected to the earth pad. In the construction of the fourth embodiment, it is not possible to prevent a change in earth potential which may be caused due to the resistance of a wiring which connects the external circuit of the chip and the emitter pad. In the present modification, a wiring for the exclusive use of earth is provided for the earth pad and is directly connected to an earth potential point of the external circuit, thereby stabilizing the circuit operation.

Embodiment 5

Figure 14:
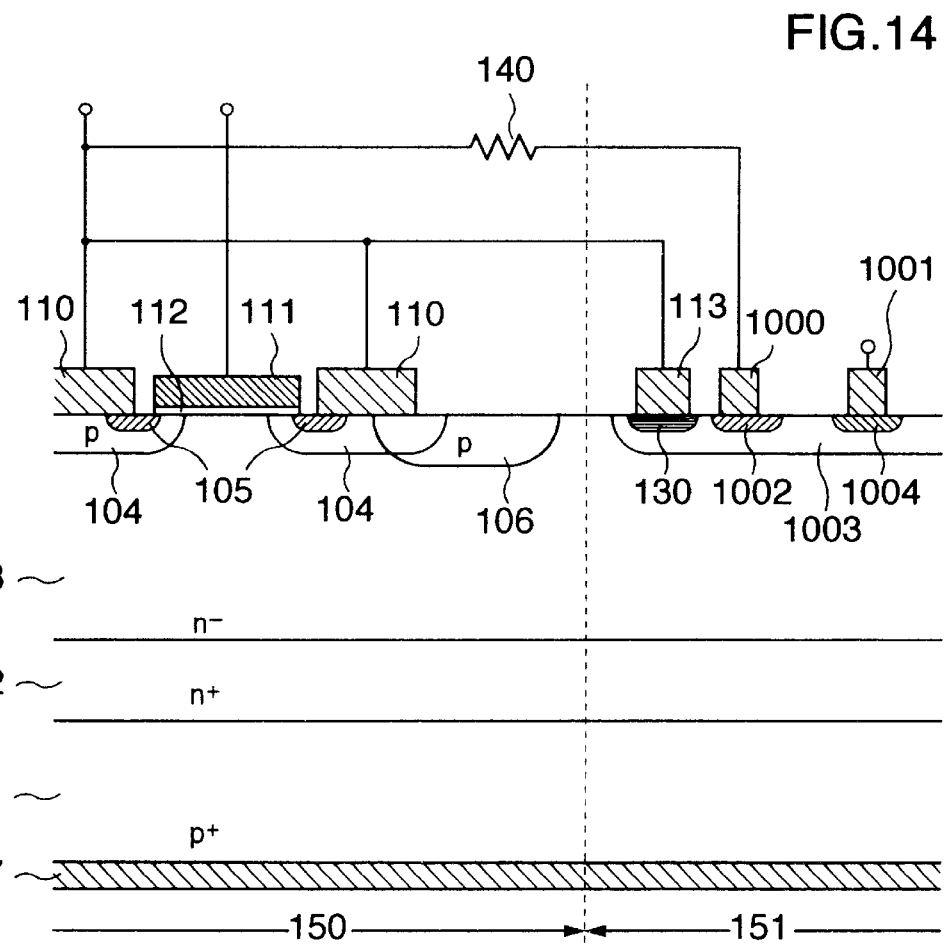
FIG. 14 is the cross section of a fifth embodiment according to the present invention.

FIG. 14 shows a cross-sectional structure of a fifth embodiment according to the present invention. In FIG. 14, the same constituent elements as those in FIGS. 1 to 13 are denoted by the same reference numerals as those in FIGS. 1 to 13. In the present embodiment, a diode as a circuit element is formed in a semiconductor layer corresponding to the base layer 132 of the circuit area in the foregoing embodiment. In a diode base layer 1003 of p type, a cathode layer 1002 of $n^+$ type having an impurity concentration higher than that of the diode base layer 1003 and an anode layer 1004 of $p^+$ type having an impurity concentration higher than that of the diode base layer 1003 are provided adjoining the other principal surface of the semiconductor substrate. A cathode electrode 1000 is provided in ohmic contact with the cathode layer 1002, and an anode electrode 1001 is provided in ohmic contact with the anode layer 1004. A diode is formed by the cathode layer 1002, the diode base layer 1003, the anode layer 1004, the cathode electrode 1000 and the anode electrode 1001. The cathode electrode 1000 and an emitter electrode 110 of an IGBT are electrically connected through a resistor 140. Further, an earth layer 130 of $p^+$ type adjoining the other principal surface of the semiconductor substrate and having an impurity concentration higher than that of the diode base layer 130 is formed in the diode base layer 1003. An earth electrode 113 is provided in ohmic contact with the earth layer 130. The earth electrode 113 and the emitter electrode 110 are electrically connected by wiring.

According to the present embodiment, a hole current injected from a collector layer 117 is ejected from the earth layer 130 to the emitter electrode 110. Accordingly, the hole current does not flow into the cathode layer 1002 of the diode, thereby making it possible to prevent an erroneous operation of the circuit.

Embodiment 6

Figure 15:
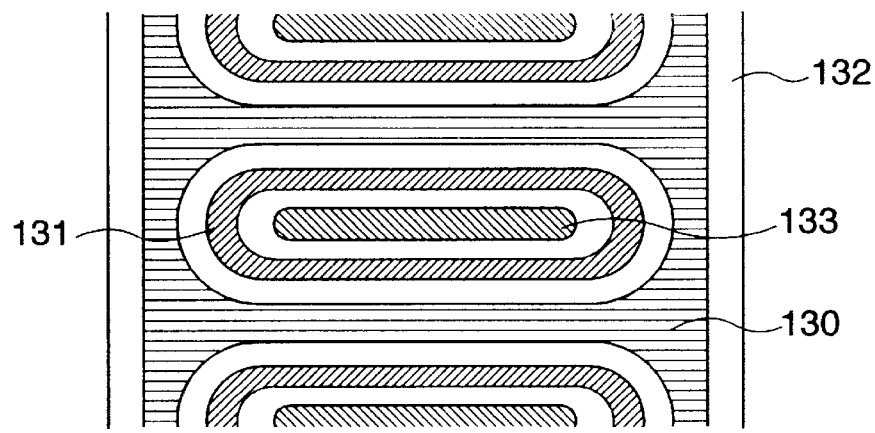
FIG. 15 is a plan view of a sixth embodiment according to the present invention.

A plane structure of a sixth embodiment according to the present invention is shown in FIG. 15. The figure shows a plane pattern of a lateral MOSFET formed in a circuit area of a circuit incorporated IGBT. Though electrodes are omitted from the illustration, the electrode pattern shown in FIG. 3 exists as an example of an electrode pattern. In FIG. 15, an elongated stripe-like drain layer 133 is disposed at a central portion of a ring-like source layer 131. The source layer 131 is surrounded by an earth layer 130. Accordingly, holes trying to flow into the source layer can effectively be ejected from the earth layer. Further, since the whole of the periphery of the source layer 131 is surrounded by the earth layer 130, little erroneous operation occurs.

Embodiment 7

Figure 16:
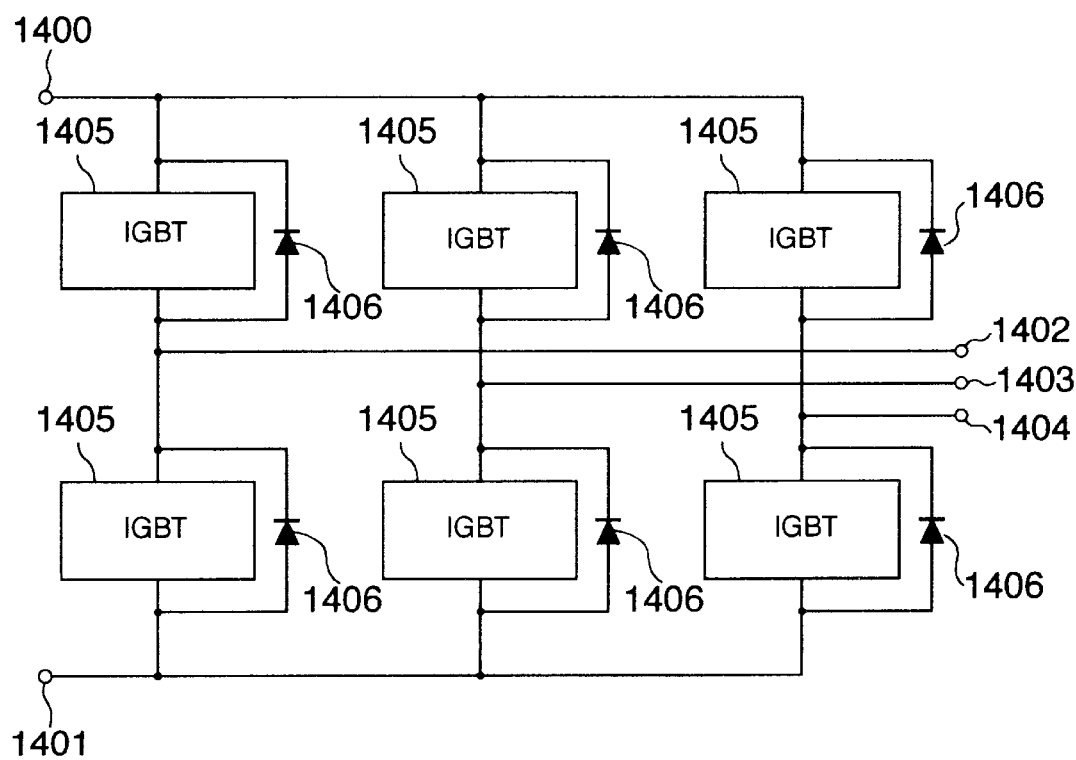
FIG. 16 is an equivalent circuit diagram of a power conversion device as a seventh embodiment according to the present invention.

FIG. 16 is an equivalent circuit diagram of a power conversion device as a seventh embodiment according to the present invention. The present embodiment corresponds to a three-phase inverter device.

In FIG. 16, reference numerals 1400 and 1401 denote DC input terminals, numeral 1405 a plurality of sets of circuit incorporated IGBT's of the present invention, each set including two circuit incorporated IGBT's connected in series between the DC input terminals, numerals 1402 to 1404 AC output terminals connected to the respective series connection points of the sets of circuit incorporated IGBT's, and numeral 1406 a freewheeling diode connected in antiparallel to each circuit incorporated IGBT. Anyone of the circuit incorporated IGBT's in the foregoing embodiments can be used as the circuit incorporated IGBT 1405. The circuit incorporated IGBT's 1405 are driven in a turn-on/off switching manner. With this on/off switching, a DC power inputted from the DC input terminals 1400 and 1401 is converted into an AC power. The AC power is outputted from the AC output terminals 1402 to 1404 to drive an AC load such as a three-phase induction motor which is connected to the AC output terminals.

In the present embodiment, a protection circuit for protecting the IGBT from an over-current is formed in the circuit area of the circuit incorporated IGBT 1405. According to the present embodiment, since a hole current flowing into the circuit area is ejected from the earth layer at the time of over-current protecting operation, it is possible to suppress the influence of the hole current on a circuit element in the circuit area. Therefore, the circuit incorporated IGBT becomes difficult to make an erroneous operation. As a result, a high-precision over-current protecting operation is enabled. Accordingly, it is possible to-realize an inverter device which has a high-reliability over-current protecting function.

The circuit incorporated IGBT according to the present invention is applicable to inverter devices as well as various power conversion devices such-as converter devices, chopper devices and various switching power supplies in which an input power is subjected to power conversion through the switching of the IGBT and the power subjected to power conversion is outputted.

In the foregoing, the present invention has been described in conjunction with the case where the n-channel IGBT is integrated with the emitter follower circuit including the n-channel MOSFET. However, a similar effect can also be obtained by the combination of a p-channel IGBT and a p-channel MOSFET. Namely, the present invention provides a similar effect even in the case where the conductivity type of each semiconductor layer in the foregoing embodiments is reversed.

Also, the circuit construction is not limited to the emitter follower circuit and a similar effect can be obtained so long as the circuit construction is a circuit integrated with a MOSFET.

Further, the present invention is not limited to the IGBT. For example, a similar effect can be obtained in the case where a circuit is integrated with a bipolar element as in a MOS controlled thyristor or the like.

According to the present invention described above, it is possible to prevent an erroneous operation of a circuit integrated with an IGBT.

What is claimed is:

1. A circuit incorporated IGBT comprising a semiconductor substrate having an IGBT area and a circuit area which are adjacent to each other, wherein:

said IGBT area includes a first layer of one conductivity type extending to said circuit area, a second layer of another conductivity type adjoining the said first layer and extending to said circuit area, a third layer of the one conductivity type formed in said second layer, a fourth layer of the other conductivity type formed in said third layer, a first electrode formed through an insulating film on a surface of said third layer between said second layer and said fourth layer, a second electrode contacting said third layer and said fourth layer, and a third electrode contacting said first layer, said circuit area includes a fifth layer of the one conductivity type formed in a portion of said second layer extending from said IGBT area, a circuit element formed in said fifth layer, a sixth layer of the one conductivity type provided adjacent to said circuit element and in said fifth layer and having an impurity concentration higher than that of said fifth layer, a fourth electrode contacting said sixth layer, a seventh layer and an eighth layer of the other conductivity type formed in said fifth layer, said seventh layer and eighth layer being separated from said sixth layer, a fifth electrode formed through an insulating film on a surface of said fifth layer between said seventh layer and said between said seventh layer and said eighth layer and said circuit element includes a circuit element electrode separate from said second electrode and electrically connected to said second electrode through another circuit element, and said second electrode and said fourth electrode are electrically connected, wherein said circuit element electrode is a sixth electrode contacting said seventh layer, said another circuit element includes a resistor and said second electrode and said sixth electrode are electrically connected through said resistor.

2. A circuit incorporated IGBT according to claim 1, wherein a plane pattern of said sixth layer is adjacent to a plane pattern of said seventh layer and extends along the plane pattern of said seventh layer.

3. A circuit incorporated IGBT according to claim 2, wherein said fourth electrode contacts said sixth layer along the plane pattern of said sixth layer.

4. A circuit incorporated IGBT according to claim 1, wherein said second layer has a first portion which adjoins said first layer and a second portion which adjoins said first portion and has an impurity concentration lower than that of said first portion, and a distance between an end portion of said first electrode nearest to said circuit area and an end portion of said seventh layer nearest to said IGBT area is equal to or larger than the thickness of said second portion of said second layer.

5. A circuit incorporated IGBT according to claim 1, wherein said fourth electrode and a connection location for connecting said second electrode to an external circuit are connected on the surface of said semiconductor substrate by a wiring electrode.

6. A power conversion device comprising an input terminal, an IGBT driven in a turn-on/off switching manner so that a power inputted to said input terminal is subjected to power conversion by the turn-on/off switching, and an output terminal for outputting the power subjected to power conversion, said IGBT including the circuit incorporated IGBT according to claim 1.

* * * * *